(12) United States Patent
Feng et al.

(10) Patent No.: US 11,881,402 B2
(45) Date of Patent: Jan. 23, 2024

(54) SELF ALIGNED MULTIPLE PATTERNING

(71) Applicant: Applied Materials, Inc., Santa Clara, CA (US)

(72) Inventors: Lili Feng, San Jose, CA (US); Madhur Singh Sachan, Belmont, CA (US); Regina Germanie Freed, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 315 days.

(21) Appl. No.: 17/381,030

(22) Filed: Jul. 20, 2021

(65) Prior Publication Data

US 2022/0102144 A1 Mar. 31, 2022

Related U.S. Application Data

(60) Provisional application No. 63/085,722, filed on Sep. 30, 2020.

(51) Int. Cl.
| | | |
|---|---|---|
| *H01L 21/033* | (2006.01) | |
| *H01L 29/06* | (2006.01) | |
| *H01L 21/311* | (2006.01) | |

(52) U.S. Cl.
CPC .... *H01L 21/0337* (2013.01); *H01L 21/31138* (2013.01); *H01L 21/31144* (2013.01); *H01L 29/0665* (2013.01)

(58) Field of Classification Search
CPC ... H01L 21/027–0338; H01L 21/31138; H01L 21/31134; H01L 29/0665; H01L 21/31144
USPC ........................................................ 257/798
See application file for complete search history.

(56) References Cited

U.S. PATENT DOCUMENTS

| | | | |
|---|---|---|---|
| 6,063,688 A * | 5/2000 | Doyle ................... | B82Y 10/00 |
| | | | 438/424 |
| 9,123,656 B1 * | 9/2015 | Hsieh ................ | H01L 21/32139 |
| 10,910,381 B2 | 2/2021 | Singh et al. | |
| 11,145,509 B2 | 10/2021 | Koshizawa et al. | |
| 2017/0372974 A1 * | 12/2017 | Tseng .................. | H01L 21/3086 |
| 2020/0335338 A1 | 10/2020 | Yang et al. | |
| 2020/0335339 A1 | 10/2020 | Yang et al. | |
| 2020/0373159 A1 | 11/2020 | Koshizawa et al. | |

(Continued)

OTHER PUBLICATIONS

U.S. Appl. No. 17/459,839, filed Aug. 27, 2021.

*Primary Examiner* — Marcos D. Pizarro
(74) *Attorney, Agent, or Firm* — Patterson + Sheridan, LLP

(57) ABSTRACT

A method for forming a nanostructure on a substrate includes performing a first lithography-and-etch process, including patterning a mandrel layer disposed on a first dielectric layer, performing a spacer patterning process, including forming a spacer layer on sidewalls of the patterned mandrel layer, performing a first gap-filling process, including forming a gap-filling layer in openings of the spacer layer on the first dielectric layer and over the patterned mandrel layer, performing a second lithography-and-etch process, including patterning the gap-filling layer and further patterning the patterned mandrel layer, performing a second gap-filling process, including further forming the gap-filling layer in openings of the twice patterned mandrel layer, and performing a spacer removing process, including removing the patterned spacer layer and the twice patterned mandrel layer.

9 Claims, 14 Drawing Sheets

(56) References Cited

U.S. PATENT DOCUMENTS

2021/0020446 A1\* 1/2021 Sieg .................... H01L 29/0673
2021/0134807 A1   5/2021 Singh et al.
2021/0296127 A1\* 9/2021 Park ................... H01L 21/0332

\* cited by examiner

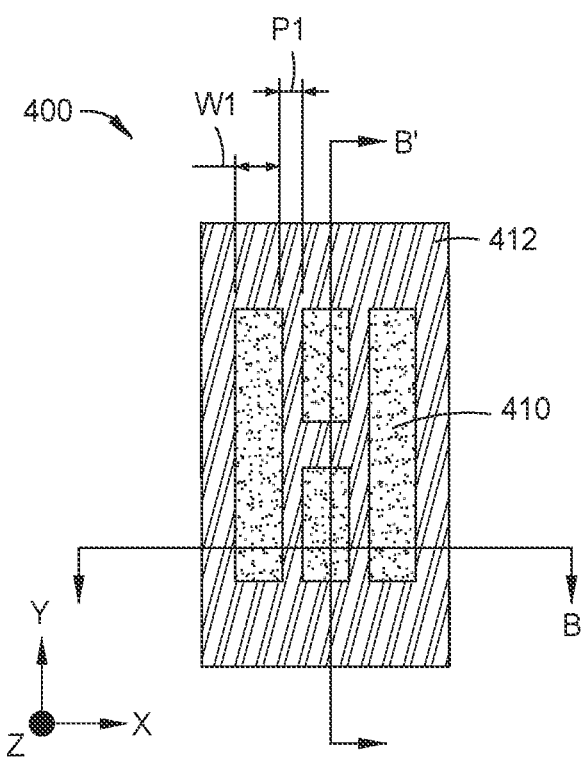
FIG. 4B"
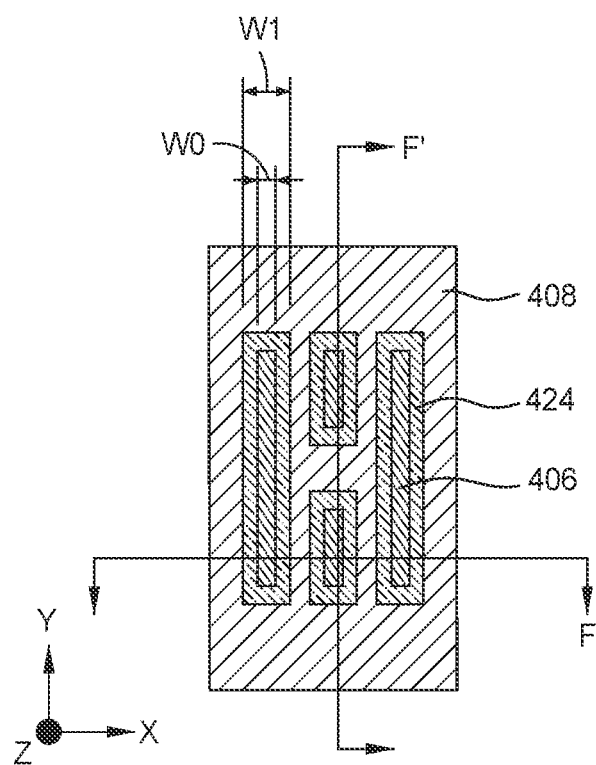
FIG. 4F"

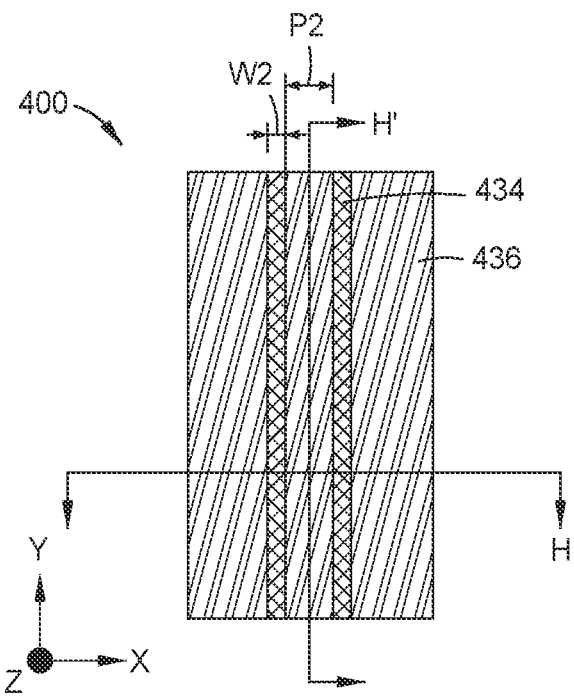
FIG. 4H"
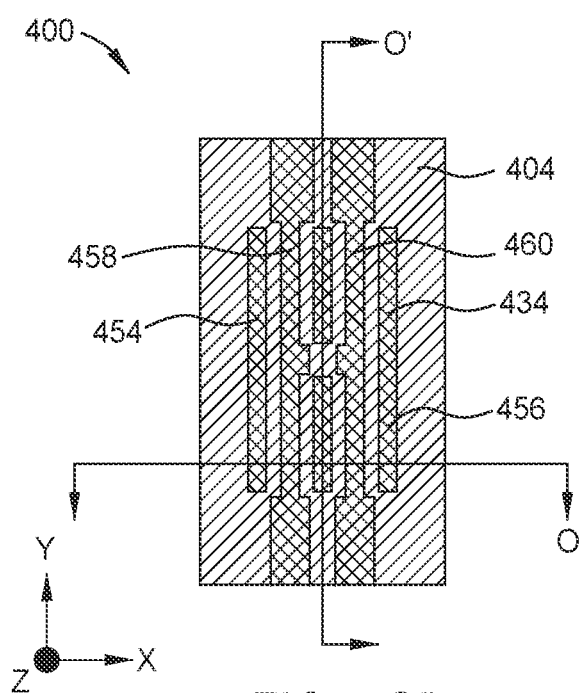
FIG. 4O"

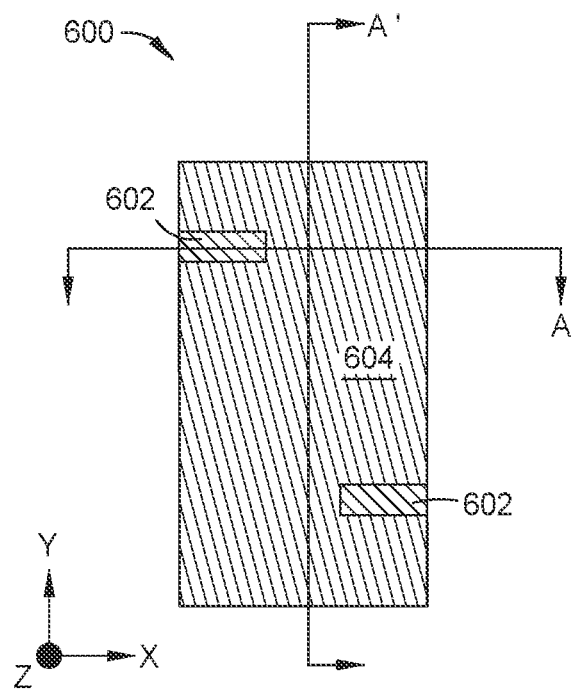
FIG. 6A"
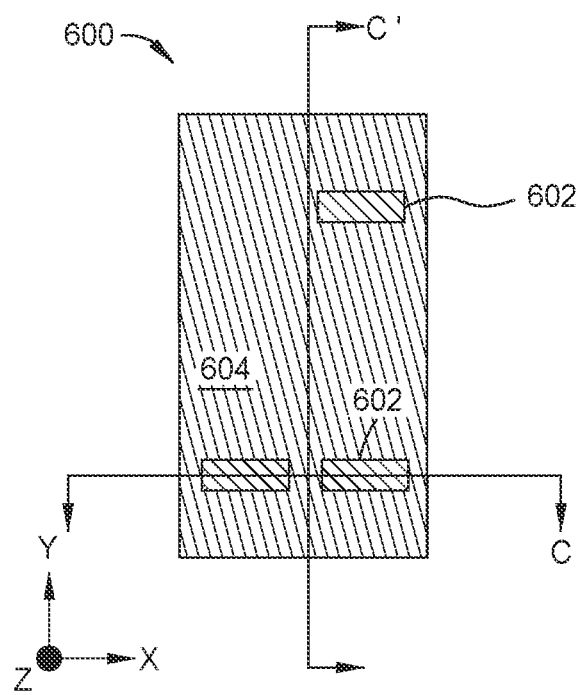
FIG. 6C"

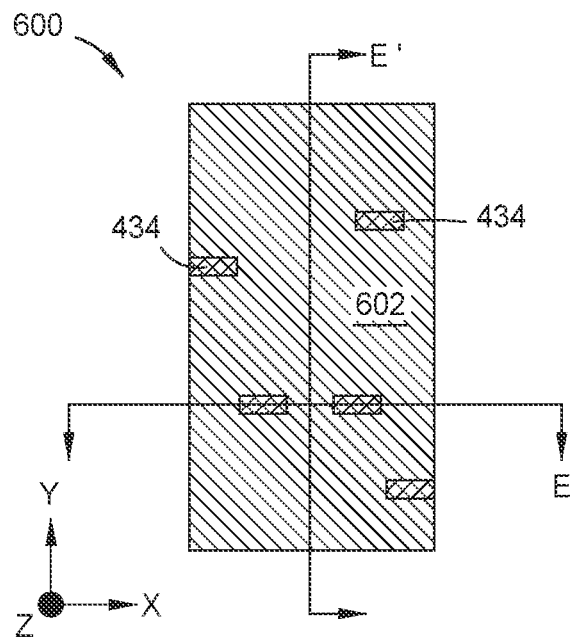
FIG. 6E"
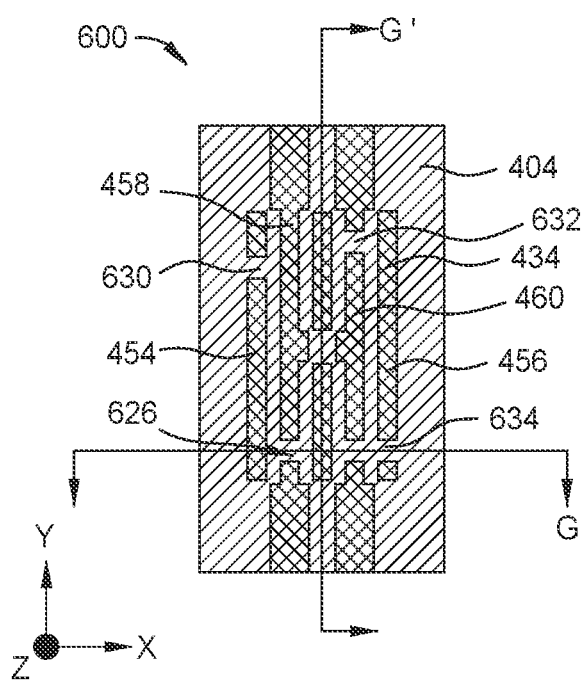
FIG. 6G"

SELF ALIGNED MULTIPLE PATTERNING

CROSS-REFERENCE TO RELATED APPLICATIONS

This application claims priority to U.S. Provisional Patent Application Ser. No. 63/085,722, filed on Sep. 30, 2020, which is incorporated by reference herein.

BACKGROUND

Field

Examples of the present disclosure generally relate to forming nanostructures in a film stack. Particularly, embodiments of the present disclosure provide methods for forming features with small dimensions with precision dimension control and minimum lithographic related errors.

Description of the Related Art

In the manufacture of integrated circuits (IC), or chips, patterns representing different layers of the chip are created by a chip designer. A series of reusable masks or photomasks are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translated into the tiny transistors and electrical circuits that comprise each completed chip. Thus, any defects in the mask may be transferred to the chip, potentially adversely affecting performance. Defects that are severe enough may render the mask completely useless. Typically, a set of 15 to 100 masks is used to construct a chip and can be used repeatedly.

With the shrinking of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. The images of the patterned mask are projected through the high-precision optical system onto the substrate surface, which is coated with a layer of photoresist layer. The patterns are then formed on the substrate surface after complex chemical reactions and follow-on manufacturing steps, such as development, post-exposure bake and wet or dry etching.

Multiple patterning technique is a technology developed for photolithography to enhance the feature density. A simple example for utilizing the multiple patterning technique is double patterning, where a conventional lithography process is enhanced to produce double the expected number of features. Double exposure is a sequence of two separate exposures of the same photoresist layer using two different photomasks. This technique is commonly used for patterns in the same layer which look very different or have incompatible densities or pitches.

Double patterning lithography (DPL) is an effective technique to improve resolution. DPL theoretically doubles resolution through pitch splitting. DPL involves two separate exposures and etch steps (litho-etch-litho-etch, or called LELE or L2E2). DPL is particularly suitable for 20 nm generation technology and is one of the promising candidate solutions for scaling down to 14 nm technology and beyond. In some structures that require feature pitch down under 10 nm, higher number of the patterning technique, such as quadruple patterning or octuple patterning (L4E4 or L8E8), may be required to push the dimension limit.

However, as the geometry limits of the structures used to form semiconductor devices are pushed against technology limits, the need for accurate feature-to-feature positioning during the multiple patterning process has become increasingly difficult to satisfy. Errors in placing edges of the features (referred to as edge placement errors, or "EPE") occur during the patterning process often result in defects, such as footing structure, corner rounding, poor line integrity or pitch dimension inaccurate, found on the transferred features, thus eventually leading device failure. Thus, the need for robust multiple patterning processes allowing an increased EPE margin has become increasingly important.

Therefore, there is a need for methods of multiple patterning with an increased EPE margin.

SUMMARY

Embodiments of the present disclosure provide a method for forming a nanostructure on a substrate. The method includes performing a first lithography-and-etch process, including patterning a mandrel layer disposed on a first dielectric layer, performing a spacer patterning process, including forming a spacer layer on sidewalls of the patterned mandrel layer, performing a first gap-filling process, including forming a gap-filling layer in openings of the spacer layer on the first dielectric layer and over the patterned mandrel layer, performing a second lithography-and-etch process, including patterning the gap-filling layer and further patterning the patterned mandrel layer, performing a second gap-filling process, including further forming the gap-filling layer in openings of the twice patterned mandrel layer, and performing a spacer removing process, including removing the patterned spacer layer and the twice patterned mandrel layer.

Embodiments of the present disclosure also provide a method for forming a nanostructure on a substrate. The method includes performing a first lithography-and-etch process, including patterning a mandrel layer disposed on a first dielectric layer, performing a spacer patterning process, including forming a spacer layer on sidewalls of the patterned mandrel layer, performing a first gap-filling process, including forming a gap-filling layer in openings of the spacer layer on the first dielectric layer and over the patterned mandrel layer, performing a second lithography-and-etch process, including patterning the gap-filling layer and further patterning the patterned mandrel layer, performing a second gap-filling process, including further forming the gap-filling layer in openings of the twice patterned mandrel layer, performing a third lithography-and-etch process, including patterning a first hardmask layer formed over the gap-filling layer, performing a fourth lithograph-and-etch process, including patterning a second hardmask layer formed over the first hardmask layer, patterning the first hardmask layer through the patterned second hardmask layer, and patterning the gap-filling layer through the patterned first hardmask layer, and performing a spacer removing process, the spacer removing process including removing the patterned spacer layer and the twice patterned mandrel layer.

Embodiments of the present disclosure further provide a nanostructure formed on a substrate. The nanostructure includes an etch stop layer disposed on a substrate, a first dielectric layer disposed on the bottom layer, a mandrel layer disposed on the first dielectric layer, the mandrel layer having openings each having a width of less than 14 nm and a pitch of less than 22 nm, a spacer layer formed on the first dielectric layer within the openings of the mandrel layer, the spacer layer having a thickness of less than 11 nm.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 6A", 6C", 6E", and 6G" are top views of a portion of a film stack according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for manufacturing nanostructures with desired small dimensions, less than 14 nanometers or beyond, are provided. The methods utilize self-aligned litho-etch-litho-etch (SALELE) with spacer patterning to form line segments that have higher density than the density of the limit of the conventional optical lithography. Furthermore, the use of a spacer in the process allows an increased margin for errors in placing edges of the features.

Figure 1:
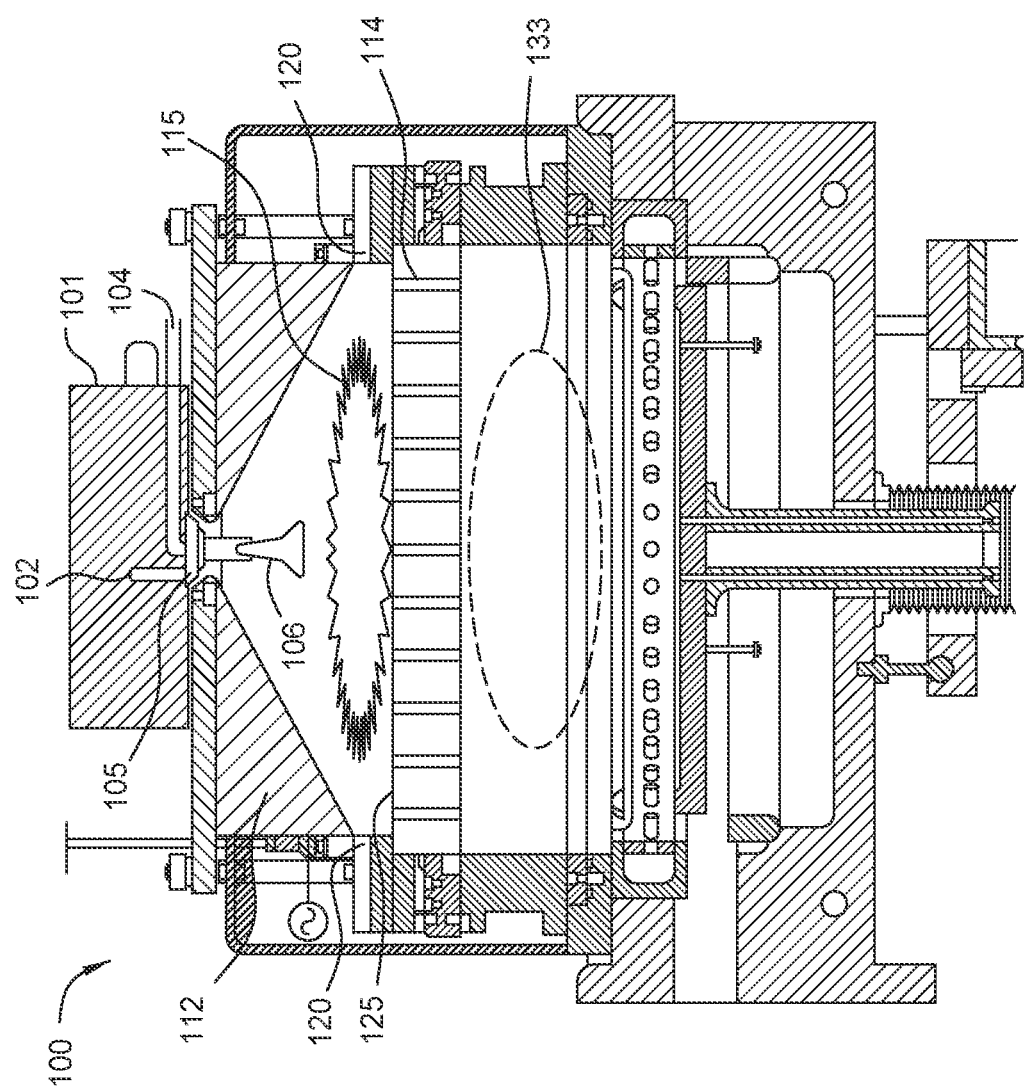
FIG. 1 depicts a processing chamber that may be utilized to perform a deposition process according to one embodiment.

FIG. 1 is a cross-sectional view of one embodiment of a flowable chemical vapor deposition chamber 100 with partitioned plasma generation regions. The flowable chemical vapor deposition chamber 100 may be utilized to deposit a flowable silicon containing layer, such as a doped silicon containing layer, onto a substrate. Other flowable silicon containing layers may include silicon oxide, silicon carbide, silicon nitride, silicon oxynitride or silicon oxycarbide, among others. During film deposition, a process gas may be flowed into a first plasma region 115 through a gas inlet assembly 105. The process gas may be excited prior to entering the first plasma region 115 within a remote plasma system (RPS) 101. The deposition chamber 100 includes a lid 112 and showerhead 125. The lid 112 is depicted with an applied AC voltage source, and the showerhead 125 is grounded, consistent with plasma generation in the first plasma region 115. An insulating ring 120 is positioned between the lid 112 and the showerhead 125 enabling an inductively coupled plasma (ICP) or a capacitively coupled plasma (CCP) to be formed in the first plasma region 115. The lid 112 and showerhead 125 are shown with the insulating ring 120 in between, which allows an AC potential to be applied to the lid 112 relative to the showerhead 125.

The lid 112 may be a dual-source lid featuring two distinct gas supply channels within the gas inlet assembly 105. A first gas supply channel 102 carries a gas that passes through the remote plasma system (RPS) 101, while a second gas supply channel 104 bypasses the RPS 101. The first gas supply channel 102 may be used for the process gas, and the second gas supply channel 104 may be used for a treatment gas. The gases that flow into the first plasma region 115 may be dispersed by a baffle 106.

A fluid, such as a precursor, may be flowed into a second plasma region 133 of the deposition chamber 100 through the showerhead 125. Excited species derived from the precursor in the first plasma region 115 travel through apertures 114 in the showerhead 125 and react with the precursor flowing into the second plasma region 133 from the showerhead 125. Little or no plasma is present in the second plasma region 133. Excited derivatives of the precursor combine in the second plasma region 133 to form a flowable dielectric material on the substrate. As the dielectric material grows, more recently added material possesses a higher mobility than underlying material. Mobility decreases as organic content is reduced by evaporation. Gaps may be filled by the flowable dielectric material using this technique without leaving traditional densities of organic content within the dielectric material after deposition is completed. A curing step may still be used to further reduce or remove the organic content from the deposited film.

Exciting the precursor in the first plasma region 115 alone or in combination with the remote plasma system (RPS) 101 provides several benefits. The concentration of the excited species derived from the precursor may be increased within the second plasma region 133 due to the plasma in the first plasma region 115. This increase may result from the location of the plasma in the first plasma region 115. The second plasma region 133 is located closer to the first plasma region 115 than the remote plasma system (RPS) 101, leaving less time for the excited species to leave excited states through collisions with other gas molecules, walls of the chamber and surfaces of the showerhead.

The uniformity of the concentration of the excited species derived from the precursor may also be increased within the second plasma region 133. This may result from the shape of the first plasma region 115, which is more similar to the shape of the second plasma region 133. Excited species created in the remote plasma system (RPS) 101 travel greater distances in order to pass through apertures 114 near the edges of the showerhead 125 relative to species that pass through apertures 114 near the center of the showerhead 125. The greater distance results in a reduced excitation of the excited species and, for example, may result in a slower growth rate near the edge of a substrate. Exciting the precursor in the first plasma region 115 mitigates this variation.

In addition to the precursors, there may be other gases introduced at different times for various purposes. For example, a treatment gas may be introduced to remove unwanted species from the chamber walls, the substrate, the deposited film and/or the film during deposition. The treatment gas may comprise at least one or more of the gases selected from the group consisting of $H_2$, an $H_2/N_2$ mixture, $NH_3$, $NH_4OH$, $O_3$, $O_2$, $H_2O_2$ and water vapor. The treatment gas may be excited in a plasma, and then used to reduce or remove a residual organic content from the deposited film. In other examples, the treatment gas may be used without a plasma. When the treatment gas includes water vapor, the delivery may be achieved using a mass flow meter (MFM) and injection valve, or by utilizing other suitable water vapor generators.

In one embodiment, the doped silicon containing layer may be deposited by introducing silicon containing precursors and reacting processing precursors in the second plasma region 133. Examples of dielectric material precursors are silicon containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$ containing precursors, such as sillyl-amine and its derivatives including trisillylamine (TSA) and disillylamine (DSA), $Si_xN_yH_zO_{zz}$ containing precursors, $Si_xN_yH_zCl_{zz}$ containing precursors, or combinations thereof.

Processing precursors include boron containing compounds, hydrogen containing compounds, oxygen containing compounds, nitrogen containing compounds, or combinations thereof. Suitable examples of the boron containing compounds include $BH_3$, $B_2H_6$, $BF_3$, $BCl_3$, and the like. Examples of suitable processing precursors include one or more of compounds selected from the group consisting of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing precursors may be plasma exited, such as in the RPS unit, to include N* and/or H* and/or O* containing radicals or plasma, for example, $NH_3$, $NH_2$*, NH*, N*, H*, O*, N*O*, or combinations thereof. The process precursors may alternatively, include one or more of the precursors described herein.

The processing precursors may be plasma excited in the first plasma region 115 to produce process gas plasma and radicals including B*, N* and/or H* and/or O* containing radicals or plasma, or combinations thereof. Alternatively, the processing precursors may already be in a plasma state after passing through a remote plasma system prior to introduction to the first plasma region 115.

The excited processing precursor is then delivered to the second plasma region 133 for reaction with the precursors though apertures 114. Once in the processing volume, the processing precursor may mix and react to deposit the dielectric materials on the substrate.

In one embodiment, the flowable CVD process performed in the deposition chamber 100 may deposit the doped silicon containing gas, such as boron (B) doped silicon layer (Si—B) or other suitable boron-silicon containing material as needed.

Figure 2:
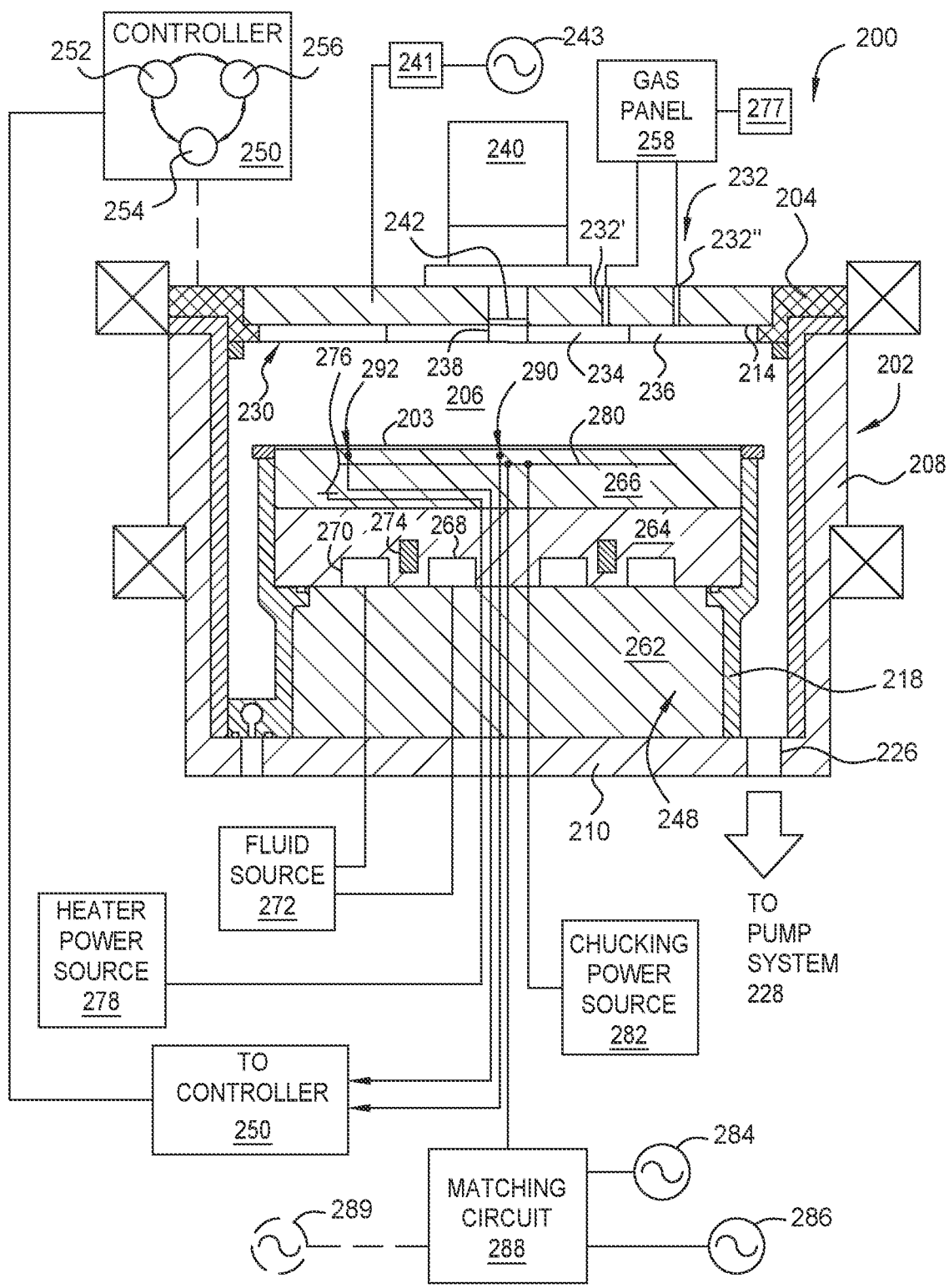
FIG. 2 depicts a processing chamber that may be utilized to perform a patterning process according to one embodiment.

FIG. 2 is a sectional view of one example of a processing chamber 200 suitable for performing a patterning process to etch a spacer layer, such as a doped silicon containing material, along with a hardmask layer on a substrate using an etching process, such as both anisotropic etching and isotropic etching. Suitable processing chambers that may be adapted for use with the teachings disclosed herein include, for example, a CENTRIS® SYM3™ processing chamber available from Applied Materials, Inc. of Santa Clara, California Although the processing chamber 200 is shown including a plurality of features that enable superior etching performance, it is contemplated that other processing chambers may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and selectively sealed by a slit valve to facilitate entry and egress of a substrate 203 from the processing chamber 200. An exhaust port 226 is defined in the chamber body 202 and couples the interior volume 206 to a vacuum pump system 228. The vacuum pump system 228 generally includes one or more pumps and throttle valves utilized to evacuate and regulate the pressure of the interior volume 206 of the processing chamber 200. In one implementation, the vacuum pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow access to the interior volume 206 of the processing chamber 200. The lid 204 includes a window 242 that facilitates optical process monitoring. In one implementation, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 203 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), and provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, California A gas panel 258 is coupled to the processing chamber 200 to provide process and/or cleaning gases to the interior volume 206. In the example depicted in FIG. 2, inlet ports 232', 232" are provided in the lid 204 to allow gases to be delivered from the gas panel 258 to the interior volume 206 of the processing chamber 200. In one implementation, the gas panel 258 is adapted to provide fluorinated process gas through the inlet ports 232', 232" and into the interior volume 206 of the processing chamber 200. In one implementation, the process gas provided from the gas panel 258 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$, and $CF_4$. Other fluorinated gases may include one or more of $C_2F$, $C_4F_6$, $C_3F_8$, and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$, and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases to flow through the showerhead assembly 230 from the inlet ports 232', 232" into the interior volume 206 of the processing chamber 200 in a predefined distribution across the surface of the substrate 203 being processed in the processing chamber 200.

A remote plasma source 277 may be optionally coupled to the gas panel 258 to facilitate dissociating a gas mixture from a remote plasma prior to entering into the interior volume 206 for processing. An RF power source 243 is coupled through a matching network 241 to the showerhead assembly 230. The RF power source 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 203 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240.

In one implementation, the showerhead assembly 230 is configured with a plurality of zones that allow for separate control of gas flowing into the interior volume 206 of the processing chamber 200. In the example illustrated in FIG. 2, the showerhead assembly 230 has an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 203 during processing. The substrate support pedestal assembly 248 generally includes a plurality of lift pins (not shown) disposed therethrough that are configured to lift the substrate 203 from the substrate support pedestal assembly 248 and facilitate exchange of the substrate 203 with a robot (not shown) in a conventional manner. An inner liner 218 may closely circumscribe the periphery of the substrate support pedestal assembly 248.

In one implementation, the substrate support pedestal assembly 248 includes a mounting plate 262, a base 264 and an electrostatic chuck 266. The mounting plate 262 is coupled to the bottom 210 of the chamber body 202 and includes passages for routing utilities, such as fluids, power lines and sensor leads, among others, to the base 264 and the electrostatic chuck 266. The electrostatic chuck 266 includes at least one clamping electrode 280 for retaining the substrate 203 below showerhead assembly 230. The electrostatic chuck 266 is driven by a chucking power source 282 to develop an electrostatic force that holds the substrate 203 to the chuck surface, as is conventionally known. Alternatively, the substrate 203 may be retained to the substrate support pedestal assembly 248 by clamping, vacuum or gravity.

At least one of the base 264 or electrostatic chuck 266 may include at least one optional embedded heater 276, at least one optional embedded isolator 274, and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 203 disposed thereon. The temperature of the electrostatic chuck 266 and the base 264 may be monitored using a plurality of temperature sensors 290, 292. The electrostatic chuck 266 may further have a plurality of gas passages (not shown), such as grooves, that are formed in a substrate support pedestal supporting surface of the electrostatic chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 203.

In one implementation, the substrate support pedestal assembly 248 is configured as a cathode and includes the electrode 280 that is coupled to a plurality of RF bias power sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the example depicted in FIG. 2, the dual RF bias power sources 284, 286 are coupled to the electrode 280 disposed in the substrate support pedestal assembly 248 through a matching circuit 288. The signal generated by the RF bias power sources 284, 286 is delivered through the matching circuit 288 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 203 is disposed on the substrate support pedestal assembly 248 in the plasma processing chamber 200. A process gas and/or gas mixture is introduced into the chamber body 202 through the showerhead assembly 230 from the gas panel 258. The vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing chamber 200 are handled through numerous signal cables.

Figure 3:
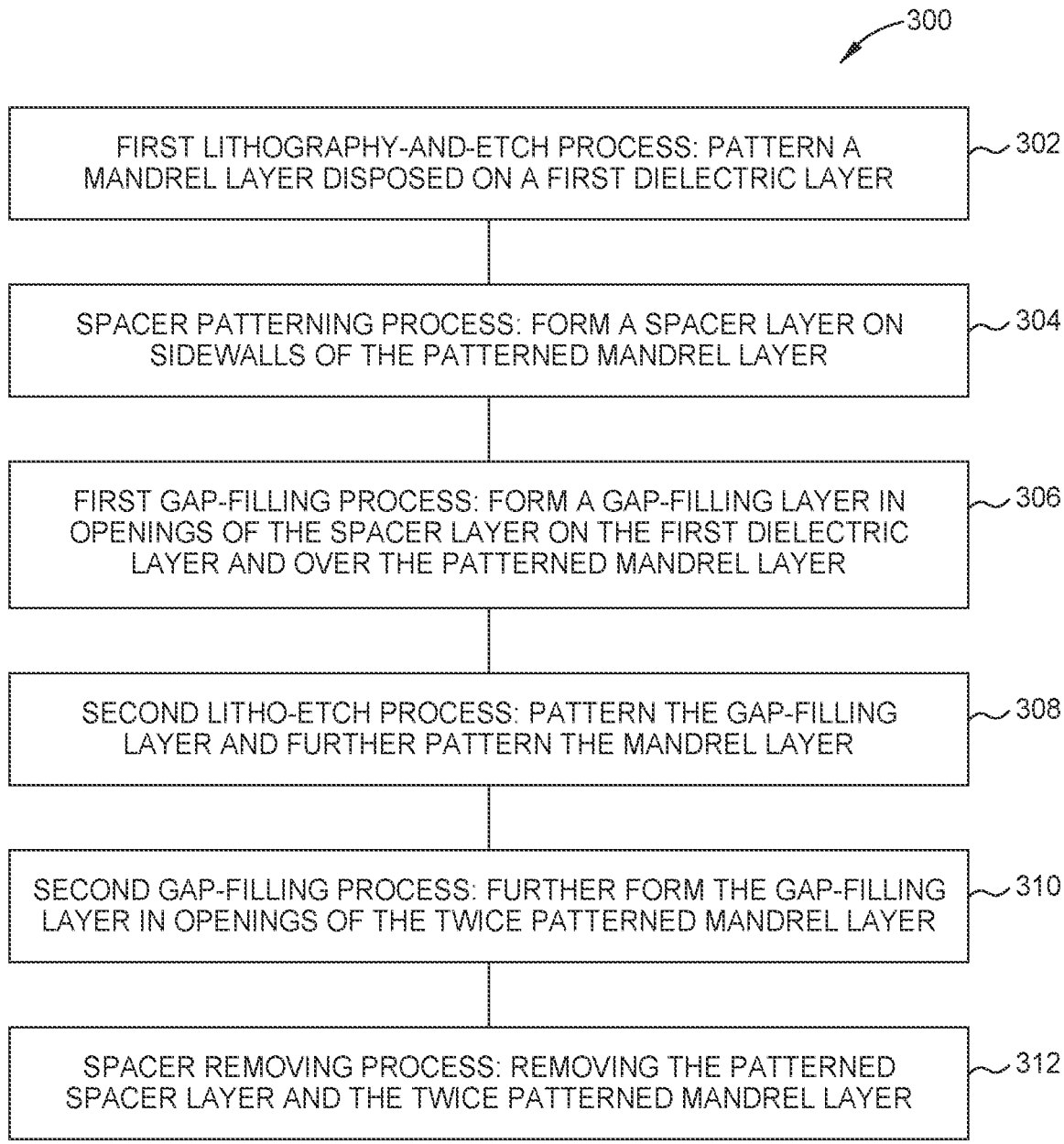
FIG. 3 is a flow diagram of a method 300 for manufacturing a film stack 400 by a self-aligned litho-etch-litho-etch (SALELE) technique for pitch splitting according to one embodiment.

FIG. 3 is a flow diagram of a method 300 for forming a nanostructure in a film stack 400 by a self-aligned litho-etch-litho-etch (SALELE) technique for pitch splitting. In the SALELE technique, spacers formed on sidewalls of patterned features and subsequently the original patterned features are removed, leaving only the spacers. Since there are two spacers for each feature, the feature density is doubled.

Figure 4A:
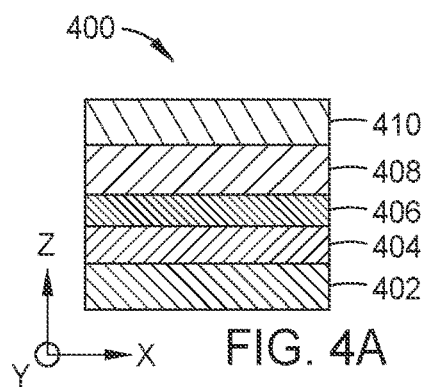
FIGS. 4A, 4A', 4B, 4B', 4C, 4C', 4D, 4D', 4E, 4E', 4F, 4F', 4G, 4G', 4H, 4H', 4I, 4I', 4J, 4J', 4K, 4K', 4L, 4L', 4M, 4M', 4N, 4N', 4O, and 4O' are cross-sectional views of a portion of a film stack according to one embodiment.
Figure 4A:
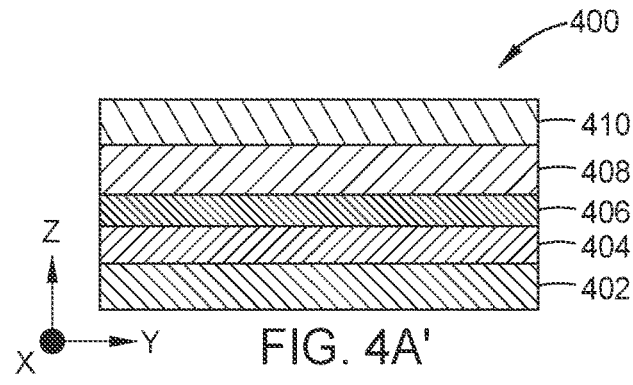
Figure 4B:
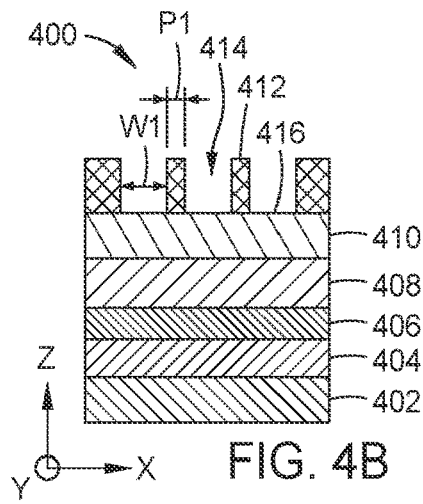
FIGS. 4B", 4F", 4H", and 4O" are top views of a portion of a film stack according to one embodiment.
Figure 4B:
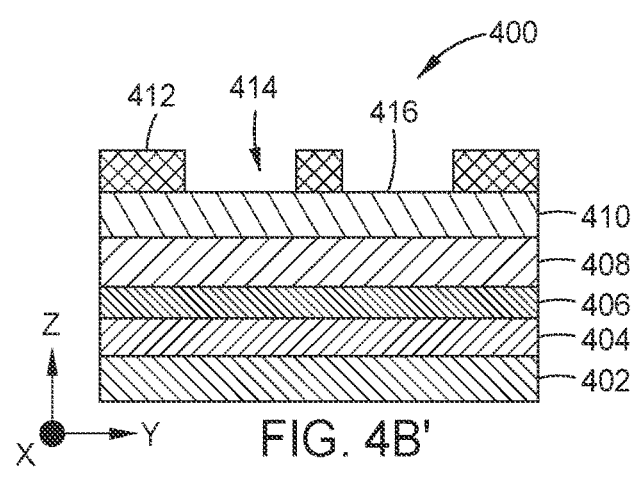

FIGS. 4A, 4A', 4B, 4B', 4C, 4C', 4D, 4D', 4E, 4E', 4F, 4F', 4G, 4G', 4H, 4H', 4I, 4I', 4J, 4J', 4K, 4K', 4L, 4L', 4M, 4M', 4N, 4N', 4O, and 4O' are cross-sectional views of a portion of the film stack 400 corresponding to various stages of the method 300. FIGS. 4B", 4F", 4H", and 4O" are top views of the portion of the film stack 400 corresponding to the portions of the film stack 400 shown in FIGS. 4B, 4B', FIGS. 4F, 4F', FIGS. 4H, 4H', and FIGS. 4O, 4O', respectively. The method 300 may be utilized to form features in a material layer, such as a contact dielectric layer, a gate electrode layer, a gate dielectric layer, a STI insulating layer, inter-metal layer (IML), or any suitable layers. Alternatively, the method 300 may be beneficially utilized to etch any other types of structures as needed.

As shown in FIGS. 4A and 4A', the film stack 400 includes a substrate 402, a bottom layer 404 disposed on the substrate 402, a first dielectric layer 406 disposed on the bottom layer 404, a mandrel layer 408 disposed on the first dielectric layer 406, and a second dielectric layer 410 disposed on the mandrel layer 408.

The substrate 402 may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The substrate 402 may have various dimensions, such as 200 mm, 300 mm, 450 mm or other diameter wafers, as well as, rectangular or square panels.

The bottom layer 404 may be formed of tetra-ethyl-orthosilicate (TEOS), silicon oxynitride (SiON), silicon oxide, silicon boride (SiBx), silicon carbonitride (SiCN), boron carbide (BC), amorphous carbon, boron nitride (BN), boron carbon nitride (BCN), carbon doped oxides, porous silicon dioxide, silicon nitride (SiN), oxycarbonitrides, polymers, phosphosilicate glass, fluorosilicate (SiOF) glass, organosilicate glass (SiOCH), other suitable oxide material, other suitable carbide material, other suitable oxycarbide material, or other suitable oxynitride material. The bottom layer 404 may function as an etch stop layer for a subsequent etch step and an insulation layer. The bottom layer 404 may be deposited on the substrate 402 using any appropriate deposition process, such as chemical vapor deposition (CVD), spin-on, physical vapor deposition (PVD), or the like.

The first dielectric layer 406 may be formed of a first type of material, such as titanium nitride (TiN), titanium (Ti), tantalum nitride (TaN), tantalum (Ta), aluminum oxide ($Al_2O_3$), titanium oxide ($TiO_2$), tungsten carbide (WC), tungsten boron carbide (WBC), silicon boride ($SiB_x$), silicon carbonitride (SiCN), boron carbide (BC), amorphous carbon, boron nitride (BN), boron carbon nitride (BCN), carbon doped oxides, porous silicon dioxide, silicon nitride (SiN), oxycarbonitrides, polymers, phosphosilicate glass, fluorosilicate (SiOF) glass, organosilicate glass (SiOCH), other suitable oxide material, other suitable carbide material, other suitable oxycarbide material, or other suitable oxynitride material that provide etch selectivity from the bottom layer 404 and the mandrel layer 408 such that the first dielectric layer 406 can function as an etch stop for a subsequent etch process. In one particular example, the first dielectric layer 406 is formed of titanium nitride (TiN). The first dielectric layer 406 may be deposited on the bottom layer 404 using any appropriate deposition process, such as chemical vapor deposition (CVD), spin-on, physical vapor deposition (PVD), or the like.

The mandrel layer 408 may be formed of a carbon containing material, such as amorphous carbon, spin-on carbon (SoC), or other suitable carbon containing material. In one particular example, the mandrel layer 408 is formed of Saphira™ Advanced Patterning Film (APF) carbon hard-mask produced by Applied Materials, Inc., located in Santa Clara, Calif. The mandrel layer 408 may be deposited by CVD, spin-on, or any other appropriate deposition process.

The second dielectric layer 410 may be formed of a second type of material, such as silicon oxide, titanium oxide, tantalum oxide, silicon boride (SiBx), silicon carbonitride (SiCN), boron carbide (BC), amorphous carbon, boron nitride (BN), boron carbon nitride (BCN), carbon doped oxides, porous silicon dioxide, silicon nitride (SiN), oxycarbonitrides, polymers, phosphosilicate glass, fluorosilicate (SiOF) glass, organosilicate glass (SiOCH), other suitable oxide material, other suitable carbide material, other suitable oxycarbide material, or other suitable oxynitride material. In some embodiments, the second dielectric layer 410 includes a spin-on carbon (SoC) hard mask on the second type of material and a spin-on glass (SoG) coating disposed on the SoC hardmask. The second dielectric layer 410 may be deposited by CVD, spin-on, or any other appropriate deposition process.

The method 300 begins at block 302 by a first lithography-and-etch process (referred to as a "litho-etch" process or a "LE" process hereinafter). At block 302, photoresist is applied onto the second dielectric layer 410 by, for example, spin coating, and subsequently exposed to intense light (e.g., extreme ultraviolet (EUV) light having wavelength of between about 124 nm to about 10 nm) with a photomask thereon. The photoresist is developed (i.e., exposed portions of the photoresist through the photomask are removed) to form a first patterned photoresist layer 412 on the second dielectric layer 410, as shown in FIGS. 4B, 4B', and 4B". The first patterned photoresist layer 412 may be formed of a metal containing photoresist, such a metal oxide extreme ultraviolet (EUV) photoresist. In some embodiments, the first patterned photoresist layer 412 has openings 414 with a width Wi of between about 3 nm and about 200 nm, for example, about 28 nm, and a pitch $P_1$ between adjacent openings of between about 3 nm and about 20 nm, for example, about 16 nm, by a single EUV exposure, near the optical resolution of a photolithography system using a high resolution photomask. The openings 414 of the first patterned photoresist layer 412 are further trimmed to increase the width $W_1$ of the openings 414 to between about 1 nm and about 200 nm, for example, about 32 nm, and decrease the pitch $P_1$ to between about 1 nm and about 200 nm, or less than about 22 nm, for example, about 12 nm.

Figure 4C:
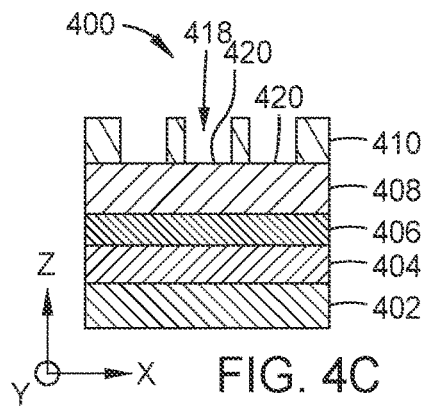
Figure 4C:
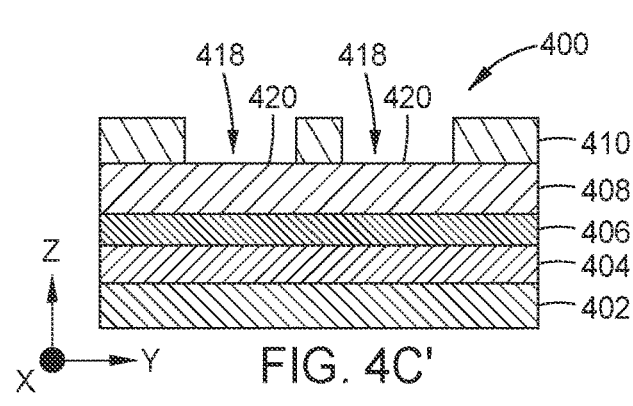
Figure 4D:
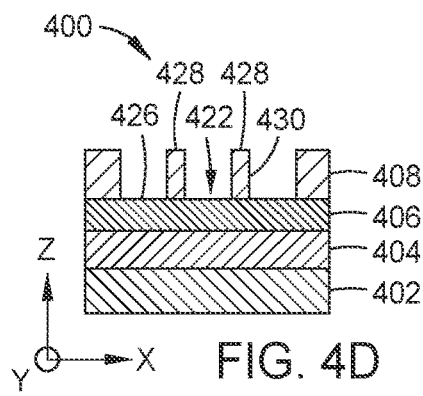
Figure 4D:
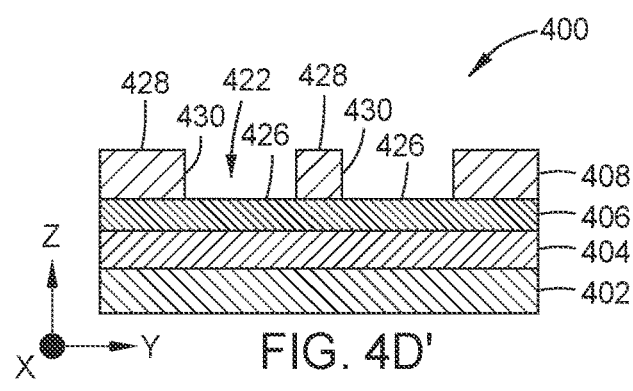

Subsequently, exposed portions 416 of the second dielectric layer 410 through the openings 414 of the first patterned photoresist layer 412 are etched to pattern the second dielectric layer 410 with openings 418 by an anisotropic etch process such as reactive ion etching (RIE), as shown in FIGS. 4C and 4C'. The first patterned photoresist layer 412 may be removed after the etching of the second dielectric layer 410, or may be consumed or removed while the etching of the oxide layer 410. Exposed portions 420 of the mandrel layer 408 through the openings 418 of the patterned second dielectric layer 410 are then etched to pattern the mandrel layer 408 with openings 422 by an anisotropic etch process such as reactive ion etching (RIE), as shown in FIGS. 4D and 4D'. The pattern of the first patterned photoresist layer 412 with the openings 414 is now transferred to the patterned mandrel layer 408.

Figure 4E:
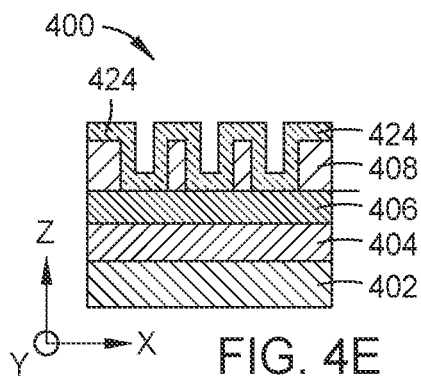
Figure 4E:
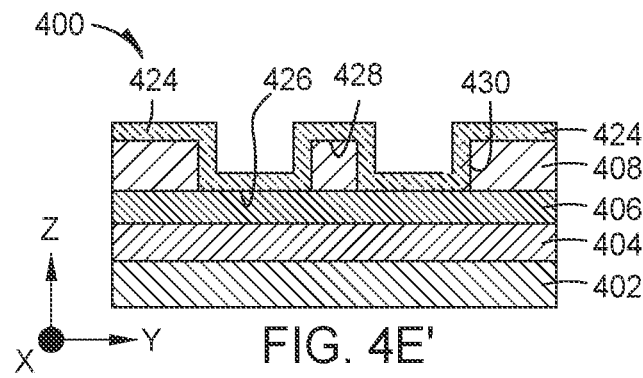
Figure 4F:
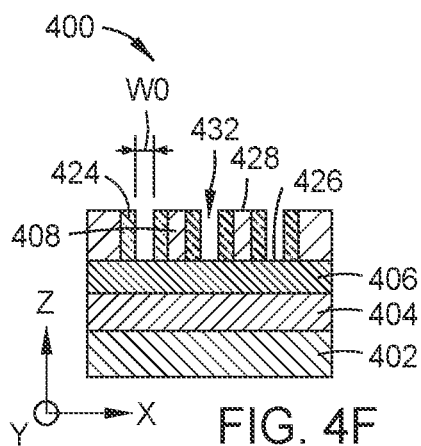
Figure 4F:
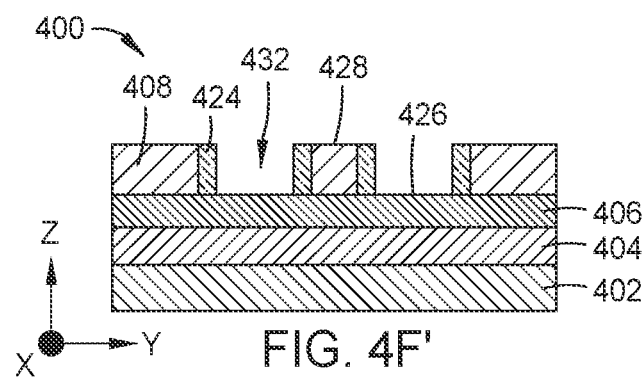

At block 304, a spacer patterning process is performed. A spacer layer 424 is first conformally deposited on exposed surface 426 of the first dielectric layer 406 through the openings 422 of the patterned mandrel layer 408, and top surfaces 428 and sidewalls 430 of the patterned mandrel layer 408, as shown in FIGS. 4E and 4E'. The spacer layer 424 may be formed using any appropriate deposition process, such as chemical vapor deposition (CVD), spin-on, physical vapor deposition (PVD), or the like. In one example, the conformally deposited spacer layer 424 has a thickness between about 1 nm and about 200 nm, or less than about 11 nm, for example, about 10 nm. Subsequently, an overburden etch process may be performed to remove portions of the spacer layer 424 from the surface 426 of the first dielectric layer 406 and the top surfaces 428 of the mandrel layer 408, leaving only portions of the spacer layer 424 on the sidewalls 430 of the mandrel layer 408, as shown in FIGS. 4F and 4F'. The overburden etch process can be any appropriate etch process, such as a dry plasma etch process. In some embodiments, openings 432 of the patterned spacer layer 424 have a width $W_0$ of between about 1 nm and about 200 nm, or less than about 14 nm, for example, about 12 nm. The width $W_0$ of the openings 432 correspond to the feature size defined by the pitch $P_1$ of the openings 414 of the first patterned photoresist layer 412 reduced by the thickness of the patterned spacer layer 424. Thus, the patterned spacer layer 424 may be further utilized as a mask layer to transfer features to the underlying layers with reduced feature sizes as needed.

The spacer layer 424 may be formed of a doped silicon containing material, such as a boron doped silicon material, phosphorus doped silicon, or other suitable group III, group IV or group V doped silicon material. The spacer layer 424 formed of a doped silicon containing material may provide good etching selectivity during a subsequent etch process. In some embodiments, the spacer layer 424 formed of a doped silicon containing material may be deposited at a temperature less than a temperature often used to deposit a silicon containing material, such as non-doped amorphous silicon. In some conventional practices, as the spacer layer 424 formed using a conventional CVD process often requires to utilize a deposition temperature greater than 400 degrees Celsius. In contrast, the doped silicon material as disclosed herein, may be formed by a CVD process at a deposition temperature less than 250 degrees Celsius, such as less than 220 degrees Celsius, such as between about 150 degrees Celsius and about 200 degrees Celsius. The relatively low deposition temperature for the doped silicon material provides wider process windows during subsequent etching/patterning processes. Furthermore, more variations and types of the materials for the nearby materials, such as the mandrel layer 408, may also be selected. For example, the low deposition temperature allows the mandrel layer 408, where the spacer layer 424 is in contact with, to be fabricated from a material that can undergo process at a temperature up to 250 degrees Celsius without substantial material alternation, film distortion, thermal decomposition (either chemically or physically) and different types of changes. As a result, some types of carbon materials, polymer materials, organic material, or photoresist materials that often can sustain a temperature less than 250 degrees Celsius, such as above 100 degrees Celsius but less than 250 degrees Celsius, may be selected for the mandrel layer 408, which may enhance the etching selectivity during a subsequent etch process. Furthermore, a deposition process appropriate for the relatively low deposition temperature, such as chemical vapor deposition (CVD) for the spacer layer 424 also provides minimum micro-loading effect as well.

Figure 4G:
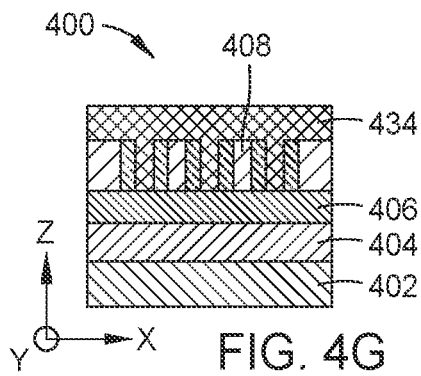
Figure 4G:
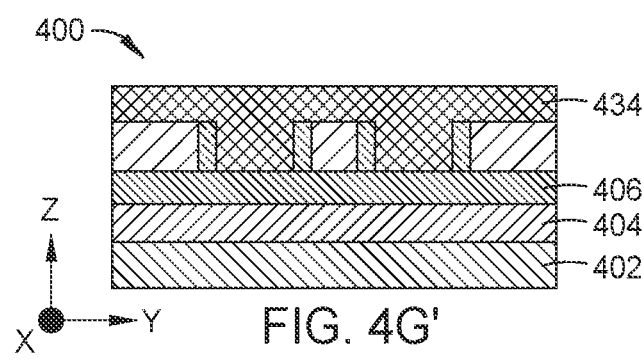

At block 306, a first gap-filling process is performed. At block 306, a gap-filling layer 434 is formed in the openings 432 of the patterned spacer layer 424 on the first dielectric layer 406, and over the patterned mandrel layer 408 and the patterned spacer layer 424, as shown in FIGS. 4G and 4G'. The gap-filling layer 434 may be formed by delivering flowable dielectric material in a liquid phase onto the exposed surfaces of the film stack 400 by an appropriate deposition process, such as a process that deposits flowable dielectric material using a flowing mechanism, and then hardening the precursor into a solid phase by steam annealing, hot pressing, and sintering at high temperatures. Example deposition processes that use a flowing mechanism include flowable CVD and spin-on coating. Other deposition processes may be used. In some examples, the flowable dielectric material includes silicon oxide, such as spin-on glass (SOG). The flowable dielectric material can be any appropriate material that provides for etch selectivity between the gap-filling layer 434 and the mandrel layer 408.

Figure 4H:
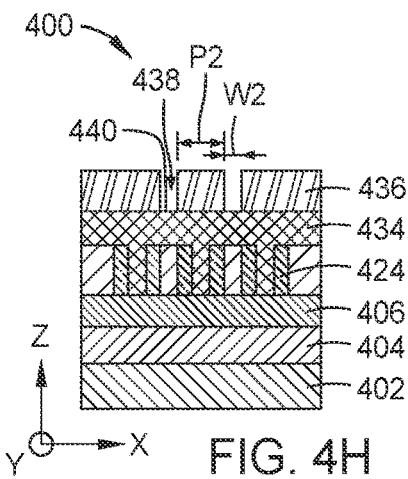
Figure 4H:
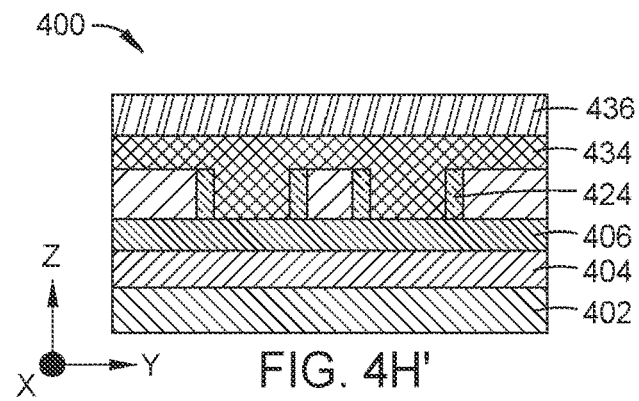

At block 308, a second litho-etch process is performed. At block 308, a second patterned photoresist layer 436 is formed on the gap-filling layer 434, as shown in FIGS. 4H, 4H', and 4H". The second patterned photoresist layer 436 may be formed of the same material as the first patterned photoresist layer 412. The second patterned photoresist layer 436 is used to etch portions of the gap-filling layer 434 above the mandrel layer 408 and thus edges of openings 438 of the second patterned photoresist layer 436 are placed aligned with edges of the patterned mandrel layer 408. However, in the edge placement, there is a margin of between about 1 nm and about 20 nm, for example, about 5 nm, corresponding to a half of the thickness of the spacer layer 424, on each side of the opening 438. In some embodiments, the openings 438 of the second patterned photoresist layer 436 have a width $W_2$ of between about 1 nm and about 200 nm, for example, about 22 nm, and a pitch $P_2$ of between about 1 nm and about 200 nm, for example, about 22 nm, by a single EUV exposure.

Figure 4I:
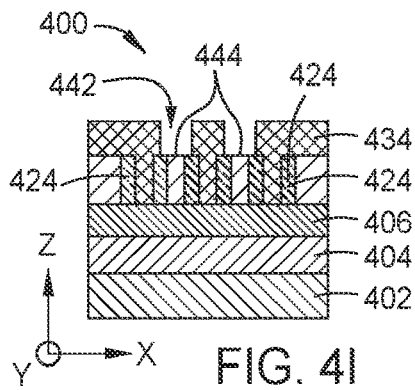
Figure 4I:
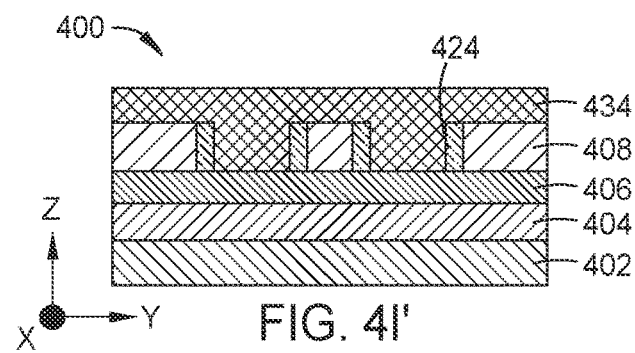
Figure 4J:
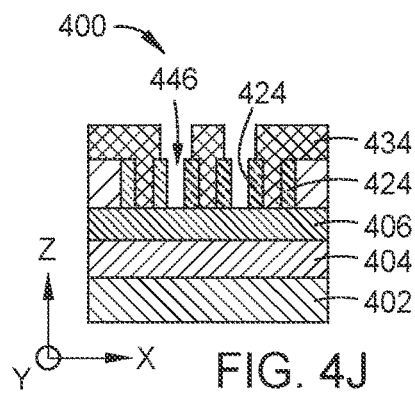
Figure 4J:
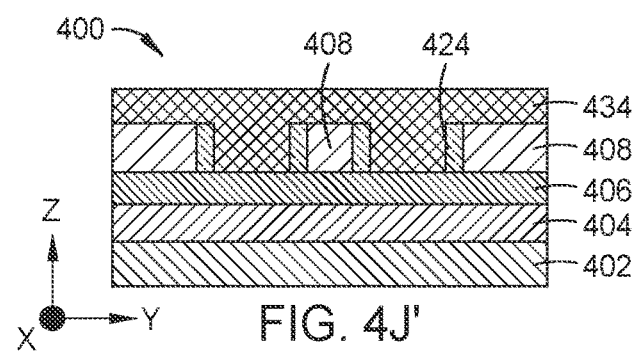

Subsequently, exposed portions 440 of the gap-filling layer 434 through the openings 438 of the second patterned photoresist layer 436 are etched to pattern the gap-filling layer 434 with openings 442 by an anisotropic etch process such as reactive ion etching (RIE), as shown in FIGS. 4I and 4I'. The second patterned photoresist layer 436 may be removed after the etching of the gap-filling layer 434, or may be consumed or removed while the etching of the gap-filling layer 434. Subsequently, exposed portions 444 of the mandrel layer 408 through the openings 442 of the patterned gap-filling layer 434 are etched to pattern the mandrel layer 408 further with openings 446 by an anisotropic etch process such as reactive ion etching (RIE), as shown in FIGS. 4J and 4J'. The patterned spacer layer 424 adjacent to the removed portions of the mandrel layer 408 may have profiles with vertical sidewalls and minimum line roughness due to high etch selectivity between materials for the spacer layer 424 and the mandrel layer 408.

Figure 4K:
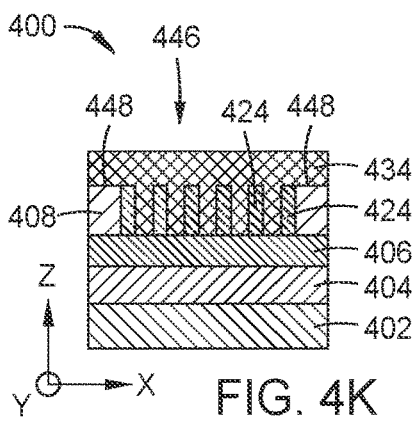
Figure 4K:
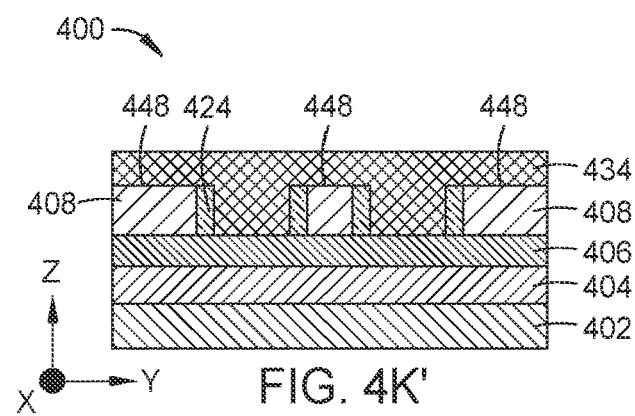
Figure 4L:
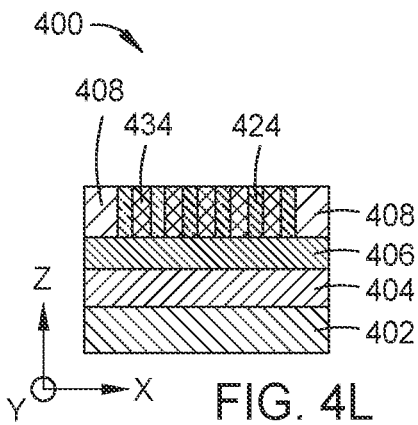
Figure 4L:
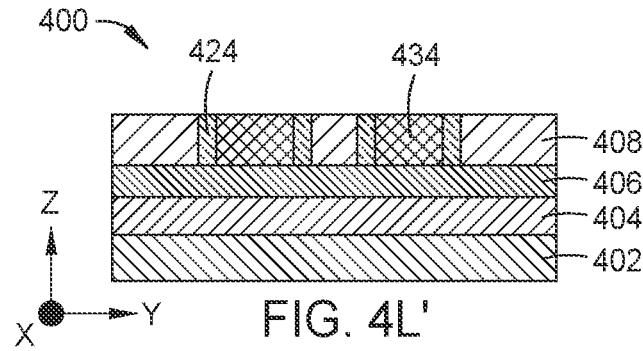

At block 310, a second gap-filling process is performed. At block 310, the gap-filling layer 434 is further formed in the openings 446 of the twice patterned mandrel layer 408, as shown in FIGS. 4K and 4K', similarly to the first gap-filling process at block 306. Subsequently, an overburden etch process may be performed to remove portions of the gap-filling layer 434 from over the patterned spacer layer 424 and the twice patterned mandrel layers 408. The overburden etch process can be any appropriate etch process, such as a dry plasma etch process. The gap-filling layer 434 can therefore be formed with top surfaces of the gap-filling layer 434, the twice patterned mandrel layer 408, and the patterned spacer layer 424 being substantially co-planar, as shown in FIGS. 4L and 4L'.

Figure 4M:
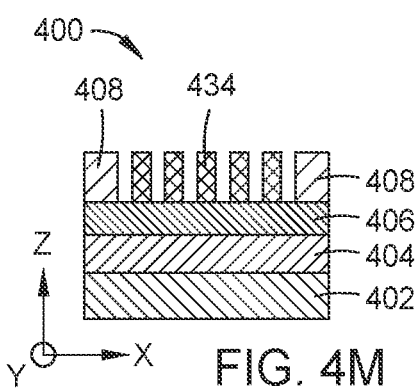
Figure 4M:
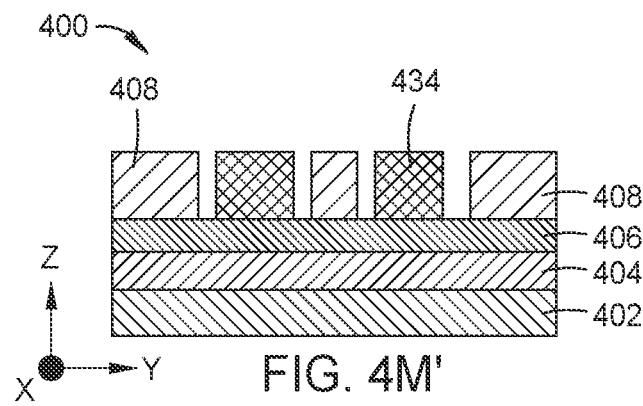
Figure 4N:
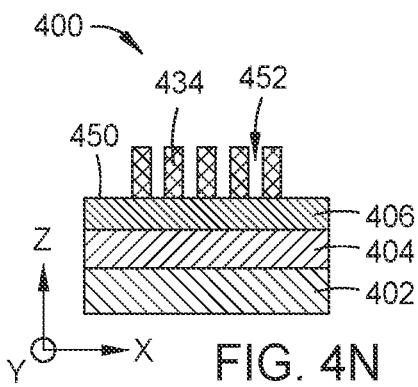
Figure 4N:
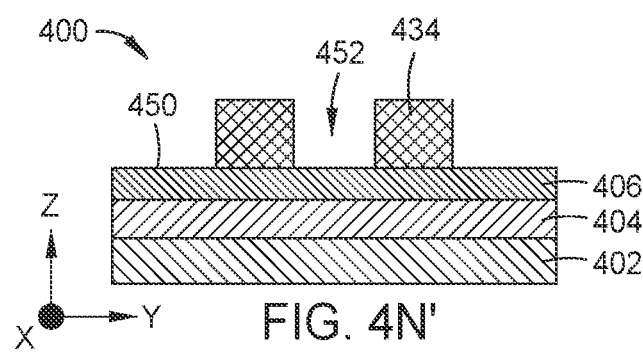
Figure 4O:
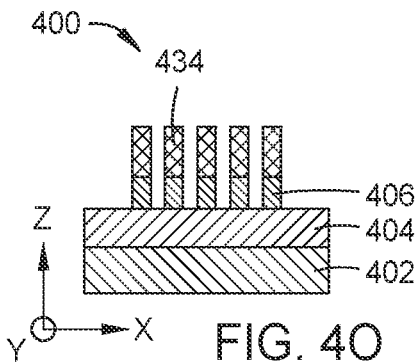
Figure 4O:
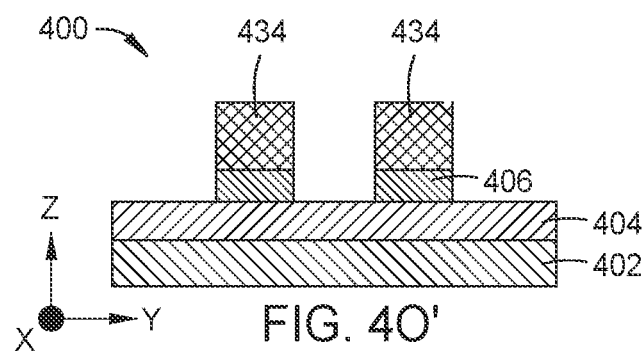

At block 312, a spacer removing process is performed. At block 312, the patterned spacer layer 424 is removed as shown in FIGS. 4M and 4M', and subsequently the twice patterned mandrel layer 408 is removed as shown in FIGS. 4N and 4N'. The spacer removing at block 312 may include two etch processes. The etch processes may be isotropic, such as a wet etch process, or anisotropic, such as a dry plasma etch process. Subsequently, exposed portions 450 of the first dielectric layer 406 are etched through openings 452 of the patterned gap-filling layer 434, as shown in FIGS. 4O, 4O", and 4O'". Line segments 454, 456, 458, 460 formed have a width of about 1 nm and about 200 nm, or less than about 14 nm, for example, about 11 nm or about 12 nm, and a pitch between adjacent line segments of between about 1 nm and about 200 nm, or less than about 22 nm, for example, about 10 nm or about 11 nm. The density of features (e.g., the line segments 454, 456, 458, 460) at this stage is approximately twice of the density of the features (e.g. the openings 414) of the first patterned photoresist layer 412 that is limited by the optical lithography.

Figure 5:
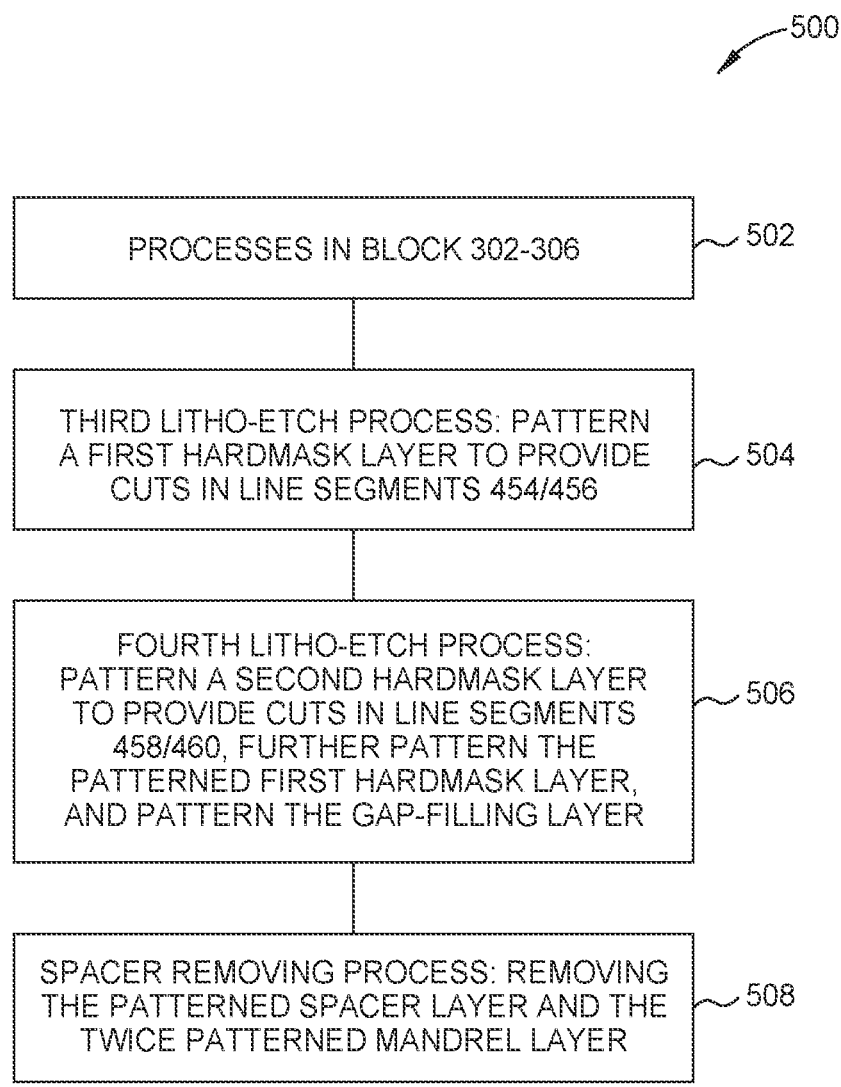
FIG. 5 is a flow diagram of a method 500 for manufacturing a film stack 600 by a self-aligned litho-etch-litho-etch (SALELE) technique for pitch splitting and line-cutting according to one embodiment.
Figure 6A:
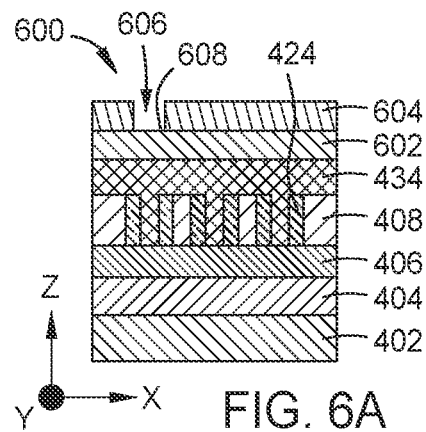
FIGS. 6A, 6A', 6B, 6B', 6C, 6C', 6D, 6D', 6E, 6E', 6F, 6F' 6G, and 6G' are cross-sectional views of a portion of a film stack according to one embodiment.
Figure 6A:
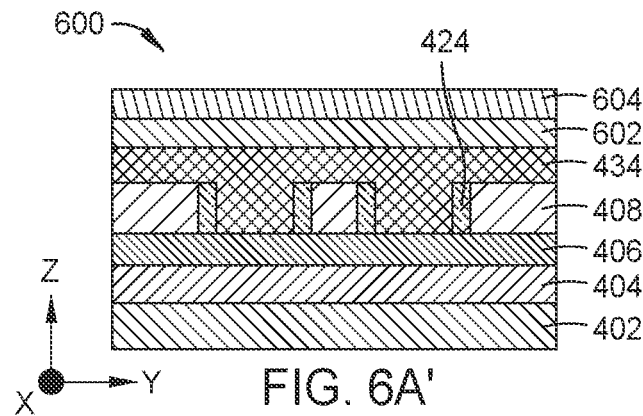

FIG. 5 is a similar flow diagram of a method 500 for forming a nanostructure on a film stack 600 by a self-aligned litho-etch-litho-etch (SALELE) technique for pitch splitting and additionally for line-cutting. In the example described herein, cut segments are formed in line segments, such as the line segments 454, 456, 458, 460 shown in FIG. 4O". FIGS. 6A, 6A', 6B, 6B', 6C, 6C', 6D, 6D', 6E, 6E', 6F, 6F' 6G, and 6G' are cross-sectional views of a portion of the film stack 600 corresponding to various stages of the method 500. FIGS. 6A", 6C", 6E", and 6G" are top views of the portion of the film stack 600 corresponding to the portions of the film stack 600 shown in FIGS. 6A, 6A', FIGS. 6C, 6C', FIGS. 6E, 6E', and FIGS. 6G, 6G', respectively. The method 500 may be utilized to form features in a material layer, such as a contact dielectric layer, a gate electrode layer, a gate dielectric layer, a STI insulating layer, inter-metal layer (IML), or any suitable layers. Alternatively, the method 500 may be beneficially utilized to etch any other types of structures as needed.

The method 500 begins at block 502 by performing processes in blocks 302 to 306 to form the film stack 400 as shown in FIGS. 4K and 4K'.

Figure 6B:
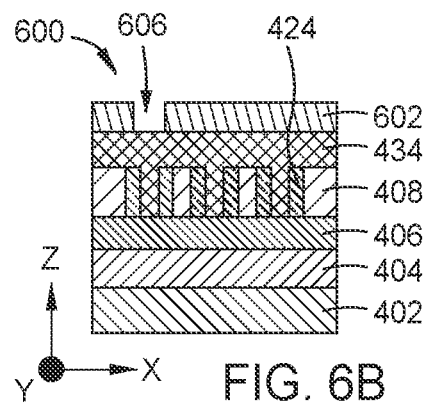
Figure 6B:
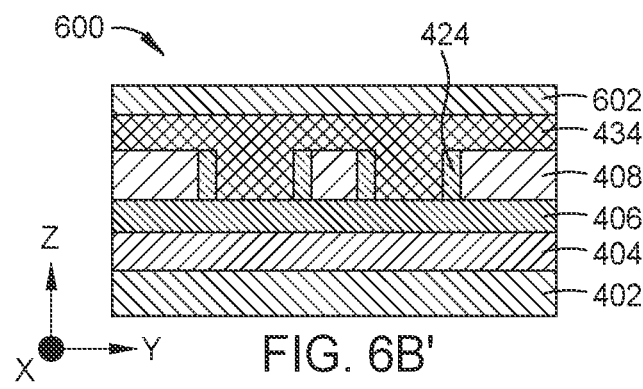

At block 504, a third litho-etch process is performed to create a first cut pattern to provide cuts 630, 632, and 634 in the line segments 454 and 456 (shown in FIG. 4O") in the following processing steps. At block 504, a first hardmask layer 602 is formed over the gap-filling layer 434 and a third photoresist layer 604 with openings 606 is formed over the first hardmask layer 602, as shown in FIGS. 6A, 6A', and 6A". The first hardmask layer 602 may be formed of a silicon containing material, such silicon oxynitride (SiON). The first hardmask layer 602 may be deposited by CVD, spin-on, or any other appropriate deposition process. Subsequently, exposed portions 608 of the first hardmask layer 602 through the openings 606 of the third photoresist layer 604 are etched to pattern the first hardmask layer 602 with openings 610 by an anisotropic etch process such as reactive ion etching (RIE), as shown in FIGS. 6B and 6B'. The third patterned photoresist layer 604 may be removed after the etching of the first hardmask layer 602, or may be consumed or removed while the etching of the first hardmask layer 602. In the example shown in FIGS. 6A, 6A', 6A", 6B, 6B', the first hardmask layer 602 is patterned to provide cuts 630, 632, and 634 in the line segments 454 and 456 (shown in FIG. 4O") in the following processing steps. However, this third litho-etch process can be used to form other features.

Figure 6C:
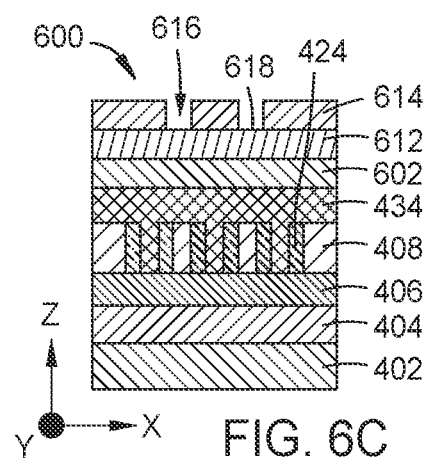
Figure 6C:
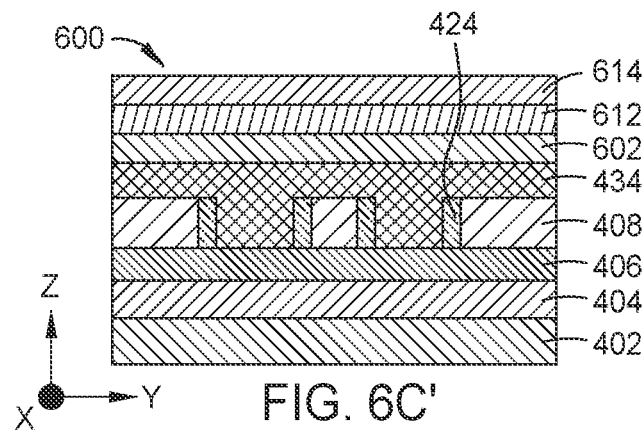
Figure 6D:
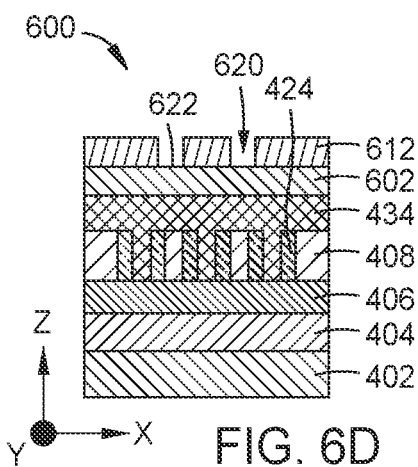
Figure 6D:
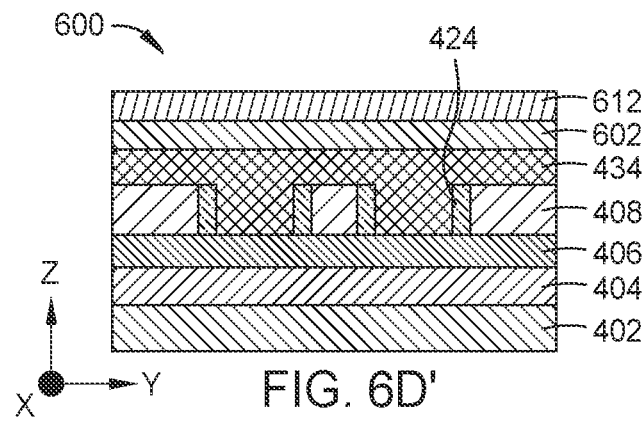
Figure 6E:
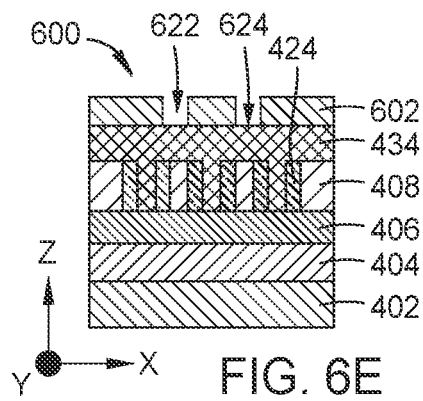
Figure 6E:
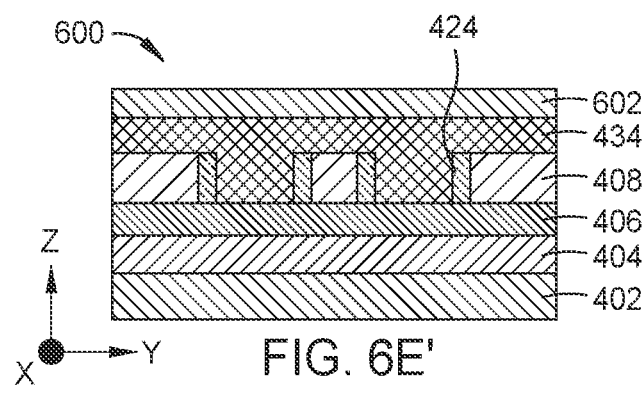
Figure 6F:
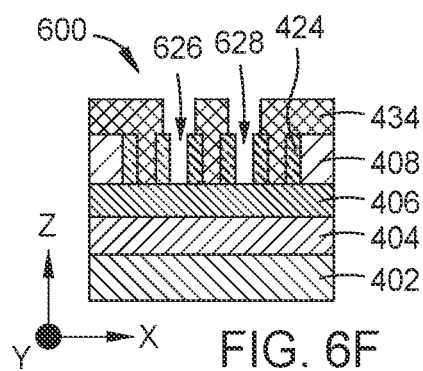
Figure 6F:
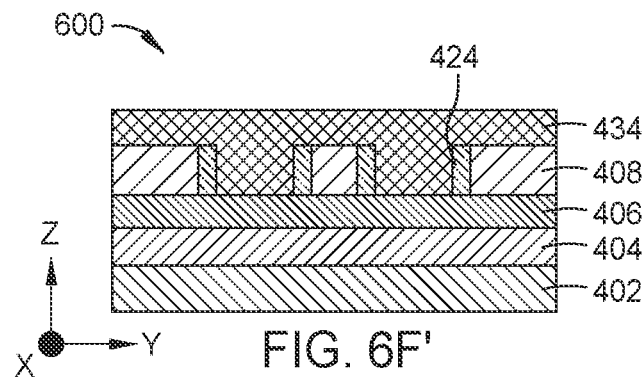

At block 506, a fourth litho-etch process is performed to create a second cut pattern to provide cuts 626 and 628 in the line segments 458 and 460, respectively, as shown in FIGS. 6F and 6F'. At block 506, a second hardmask layer 612 is formed over the patterned first hardmask layer 602 and a fourth photoresist layer 614 with openings 616 is formed over the second hardmask layer 612, as shown in FIGS. 6C, 6C', and 6C". The second hardmask layer 612 may be formed of a carbon containing material, such as a spin-on carbon (SoC). The second hardmask layer 612 may be deposited by CVD, spin-on, or any other appropriate deposition process. Subsequently, exposed portions 618 of the second hardmask layer 612 through the openings 616 of the fourth photoresist layer 614 are etched to pattern the second hardmask layer 612 with openings 620, as shown in FIGS. 6D, 6D'. The fourth patterned photoresist layer 614 may be removed after the etching of the second hardmask layer 612, or may be consumed or removed while the etching of the second hardmask layer 612. Exposed portions 622 of the first hardmask layer 602 through the openings 620 of the second hardmask layer 612 are then etched to pattern the first hardmask layer 602 with openings 620 by an anisotropic etch process such as reactive ion etching (RIE), as shown in FIGS. 6E and 6E'. In the example shown in FIGS. 6C, 6C', 6C", 6D, 6D', 6E, 6E', the first hardmask layer 602 is patterned to provide cuts in the line segments 458, 460 (shown in FIGS. 4O") in the following processing steps. However, this third litho-etch process can be used to form other features. Subsequently, exposed portions 624 of the gap-filling layer 434 through the openings 620 of the first hardmask layer 602 are etched to provide cuts 626, 628 in the line segments 458, 460, respectively, as shown in FIGS. 6F and 6F', and cuts 630, 632, 634 (shown in FIG. 6G") in the line segments 454, 456. Subsequently, an overburden etch process may be performed to remove portions of the gap-filling layer 434 from over the patterned spacer layer 424 and the patterned mandrel layer 408, similarly to block 310.

Figure 6G:
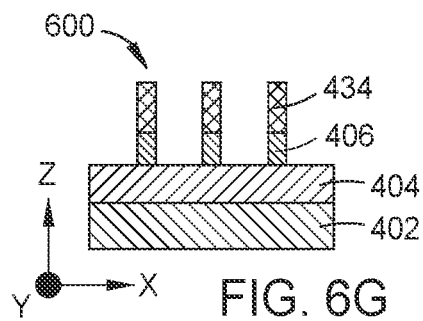
Figure 6G:
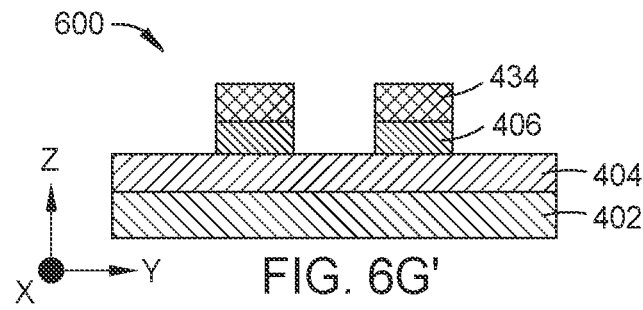

At block 508, a spacer removing process is performed. At block 508, the patterned spacer layer 424 and the patterned mandrel layer 408, similarly to block 312, and then the underlayer is etched through the patterned gap-filling layer 434, similarly to block 314, as shown in FIGS. 6G, 6G', 6G". The line segments 454, 456, 458, 460 of the film stack 600 formed by the method 500 have the same density of features as those in the film stack 400 and further include the cut segments.

In the embodiments described herein, methods for manufacturing nanostructures with desired small dimensions, less than 14 nanometers or beyond, are provided. The methods utilize self-aligned litho-etch-litho-etch (SALELE) with spacer patterning to form line segments that have density approximately twice of the density of the limit of the conventional optical lithography. Furthermore, the use of a spacer in the process allows an increased margin for errors in placing edges of the features.

While the foregoing is directed to embodiments of the present disclosure, other and further embodiments of the disclosure may be devised without departing from the basic scope thereof, and the scope thereof is determined by the claims that follow.

What is claimed is:

1. A method for forming a nanostructure on a substrate, the method comprising:
    performing a first lithography-and-etch process, comprising patterning a mandrel layer disposed on a first dielectric layer;
    performing a spacer patterning process, comprising forming a spacer layer on sidewalls of the patterned mandrel layer;
    performing a first gap-filling process, comprising forming a gap-filling layer in openings of the spacer layer on the first dielectric layer and over the patterned mandrel layer;
    performing a second lithography-and-etch process, comprising patterning the gap-filling layer and further patterning the patterned mandrel layer;
    performing a second gap-filling process, comprising further forming the gap-filling layer in openings of the twice patterned mandrel layer; and
    performing a spacer removing process, comprising removing the patterned spacer layer and the twice patterned mandrel layer.

2. The method of claim 1, wherein the patterned mandrel layer has openings having a width of between 1 nm and 200 nm and a pitch of between 1 nm and 200 nm.

3. The method of claim 1, wherein the mandrel layer comprises a carbon containing material.

4. The method of claim 1, wherein the forming of the spacer layer on the sidewalls of the patterned mandrel layer in the spacer patterning process comprises:
    conformally depositing the spacer layer in openings of the patterned mandrel layer on the first dielectric layer, top surfaces and the sidewalls of the patterned mandrel layer; and
    etching the spacer layer such that only portions on the sidewalls of the patterned mandrel layer are left.

5. The method of claim 1, wherein the spacer layer has a thickness of between 1 nm and 200 nm.

6. The method of claim 1, wherein the patterned spacer layer has openings having a width of between 1 nm and 200 nm and a pitch of between 1 nm and 200 nm.

7. The method of claim 1, wherein the spacer layer comprises a doped silicon containing material.

8. The method of claim 1, wherein
    the forming of the gap-filling layer in the first gap-filling process comprises:
        delivering flowable dielectric material in the openings of the spacer layer on the first dielectric layer and over the patterned mandrel layer; and
        hardening the flowable dielectric material, and
    the further forming of the gap-filling layer in the second gap-filling process comprises:
        delivering the flowable dielectric material in the openings of the twice patterned mandrel layer;
        hardening the flowable dielectric material; and
        removing portions of the gap-filling layer from over the patterned spacer layer and the twice patterned mandrel layers.

9. The method of claim 8, wherein the flowable dielectric material comprises silicon oxide.

* * * * *